(12) United States Patent
Glinkowski

(10) Patent No.: US 6,469,490 B1
(45) Date of Patent: Oct. 22, 2002

(54) CURRENT LIMITING IN POWER SYSTEMS USING HALL EFFECT DEVICE

(75) Inventor: Mietek T. Glinkowski, Raleigh, NC (US)

(73) Assignee: ABB Inc., Raleigh, NC (US)

( * ) Notice: Subject to any disclaimer, the term of this patent is extended or adjusted under 35 U.S.C. 154(b) by 60 days.

(21) Appl. No.: 09/603,342

(22) Filed: Jun. 26, 2000

(51) Int. Cl.⁷ .................. G01R 33/00; G01R 33/02; H01L 43/08; H01L 43/06; G05E 1/635
(52) U.S. Cl. ............. 324/117 H; 324/252; 338/32 R; 338/32 H; 338/325; 323/294
(58) Field of Search .............. 324/252, 207.2, 324/347, 117 H; 257/425; 323/368, 294; 360/327.11; 338/32 R, 32 H, 32 S; 361/93.9; 327/511

(56) References Cited

U.S. PATENT DOCUMENTS

| | | | |
|---|---|---|---|
| 2,877,394 A | * 3/1959 | Kuhrt .................. 324/251 |
| 3,189,815 A | * 6/1965 | Barabutes et al. .......... 323/215 |
| 3,678,367 A | 7/1972 | McMurray ................ 321/7 |
| 4,020,440 A | 4/1977 | Moerman ................ 336/155 |
| 4,163,190 A | 7/1979 | Moerman .................. 323/6 |
| 4,284,983 A | 8/1981 | Lent ..................... 340/568 |
| 4,471,355 A | 9/1984 | Hardy et al. .......... 340/870.31 |
| 4,516,182 A | 5/1985 | Franklin ................. 361/13 |
| 4,668,914 A | 5/1987 | Kersten et al. ........... 324/251 |
| 4,731,570 A | 3/1988 | Lee ..................... 318/696 |
| 5,065,130 A | * 11/1991 | Eck et al. .............. 338/32 R |
| 5,396,165 A | 3/1995 | Hwang et al. ............. 323/210 |
| 5,430,362 A | 7/1995 | Carr et al. .............. 318/779 |
| 5,491,461 A | * 2/1996 | Partin et al. ............ 338/32 R |
| 5,763,928 A | * 6/1998 | Hennig ................. 257/421 |
| 5,898,296 A | 4/1999 | Maddox et al. ............ 323/282 |

* cited by examiner

Primary Examiner—N. Le
Assistant Examiner—Anjan K. Deb

(57) ABSTRACT

A current limiting apparatus and method for use in a power system is provided. Current flows from a power system to a first magnetic field producing contact. A Hall effect device is disposed between the first magnetic field producing contact and another magnetic field producing contact. In this manner, the Hall effect device is subjected to a magnetic field produced by the two contacts. The limited current is then provided to another portion of the power system or to another power system.

19 Claims, 6 Drawing Sheets

CURRENT LIMITING IN POWER SYSTEMS USING HALL EFFECT DEVICE

FIELD OF THE INVENTION

The present invention relates generally to power systems, and more particularly to limiting AC and DC currents in power systems by using Hall effect devices.

BACKGROUND OF THE INVENTION

Means for limiting high AC and DC currents are well known in the art. Limiting high DC currents sufficiently rapidly is difficult, since the circuit DC current could double or triple in a few msec. The current limiting apparatus must therefore respond quickly at low or moderate circuit overload. In a typical case, for example, a 700 volt DC supply will operate with a current output normally in the range of 50 kiloamperes (kA). A short circuit may cause the current to increase at a rate of 25 kA/msec up to as high as 200 kA. Unless this current is quickly limited, circuit damage from burning caused by excess heat generation is likely. Magnetic forces between adjacent conductors carrying such currents in opposite directions also increase as the square of the current, thereby providing a second probable cause for circuit damage. Existing methods for limiting high AC and DC currents include the use of fuses, circuit breakers and crowbar protective circuits.

The difficulty with most fuses is that they require a high overload current, on the order of 30 to 50 times the normal circuit current, to blow within one or two milliseconds. This is because the fuses are designed to carry large continuous currents under normal operation, being a series element in the circuit between the power source and the load. Such fuses also are disadvantageous, since they have poor voltage clearing capabilities. Voltage clearing is the process of clearing away conductive matter in the fuse so that arcing is not enabled through the remnant material once the fuse has blown. Fuses that are required to conduct high currents must have a very low resistance to minimize heating and power loss during normal operation. This requires that the fusible element have a large cross section, which does not clear well.

Circuit breakers are also disadvantageous, since they are mechanical devices, tend to be too slow and may not be capable of breaking circuits having high currents in the range of many kA due to arcing across the breaker contacts, or other problems. Crowbar protective circuits are similarly undesirable, since they add to the overload on the power supply and the power bus during a fault condition. In general, considerations of mountings, lead breakouts, connections, resistance, and space requirements also make such devices poor choices as high power current limiting devices.

In addition, magnetic forces resulting from the high currents in such circuits may affect circuit breaker or crowbar protective current switches adversely. Many switch designs in the prior art do not take into account strong magnetic forces, and thus risk malfunction of the switch.

Arc clearing is a problem with most of these switches, such that auxiliary commutating circuits to quickly generate current zeros are usually required. This causes the switches that interrupt a circuit suddenly to generate high transient voltages which inhibit the suppression of arcing during switch contact opening. These high voltage transients may also cause damage to other parts of the system, e.g., to the power supply insulation.

Other prior art limiting devices are mechanical in nature such that physical movement and control of contacts and/or sensors are required. This is not desirable because such devices are expensive and unreliable.

Therefore, there remains a need for systems and methods for limiting current that avoids the above described drawbacks of the prior art.

SUMMARY OF THE INVENTION

The present invention is directed to a current limiting apparatus comprising a first contact, a second contact, and a Hall effect device disposed in electrical contact with the first contact and the second contact. The first and second contacts are each capable of generating an axial magnetic field for the Hall effect device.

According to one aspect of the invention, the first and second contacts are substantially identical.

According to further aspects of the present invention, each of the first contact and the second contact has a base terminal and at least one connection surface, and the base terminal or the connection surface(s) is (are) in electrical contact with the Hall effect device.

Another embodiment of the present invention is directed to a method of limiting current in a power system comprising providing current to a Hall effect device, generating an axial magnetic field, and subjecting the Hall effect device to the axial magnetic field to limit the current.

According to further aspects of the present invention, generating the axial magnetic field comprises providing current to a first contact and a second contact, and the Hall effect device is disposed between and in electrical contact with the first contact and the second contact.

According to further aspects of the present invention, subjecting the Hall effect device to the axial magnetic field to limit the current comprises changing the impedance of the Hall effect device using the axial magnetic field.

The foregoing and other aspects of the present invention will become apparent from the following detailed description of the invention when considered in conjunction with the accompanying drawings.

DESCRIPTION OF EXEMPLARY EMBODIMENTS AND BEST MODE

The present invention is directed to limiting AC and DC currents in power system applications by using a Hall effect device. In power systems, the magnetic field required for achieving the Hall effect resistance change can be obtained from a contact geometry structure that preferably also acts as a holder for the Hall effect device.

Figure 1:
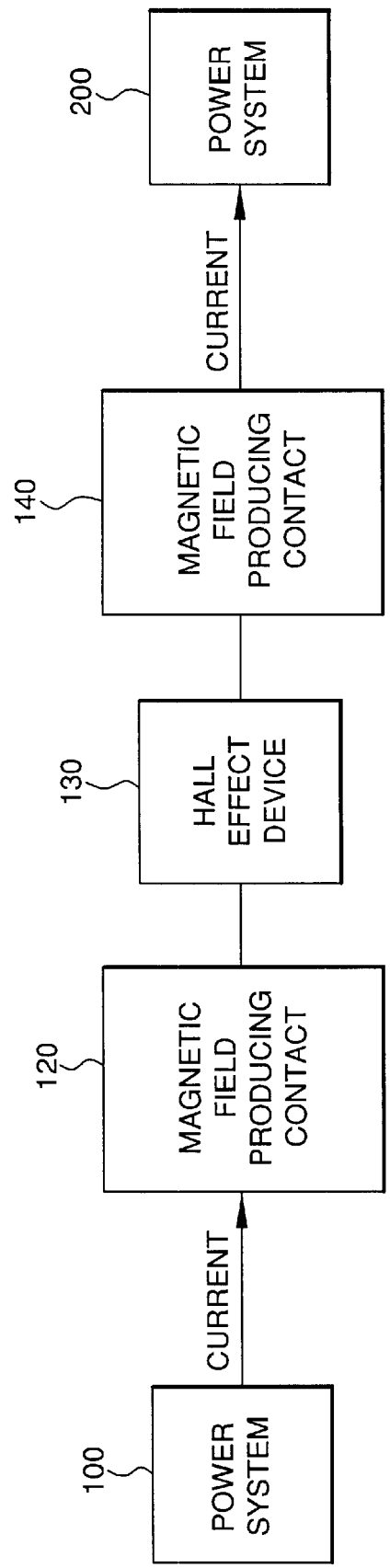
FIG. 1 is a schematic diagram of an exemplary current limiter for use in a power system in accordance with the present invention.

An exemplary current limiter for use in a power system in accordance with the present invention is shown in FIG. 1. Current flows from a power system 100 to a magnetic field producing contact 120. A conventional Hall effect device 130 is disposed between the magnetic field producing contact 120 and another (magnetic field producing) contact 140 (the contacts 120 and 140 form a magnetic field producing contact structure). In this manner, the Hall effect device 130 is subjected to the magnetic fiel produce by the contact structure 120 and 140. The current is then limited between the power system 100 and another power system 200, as shown.

Figure 2:
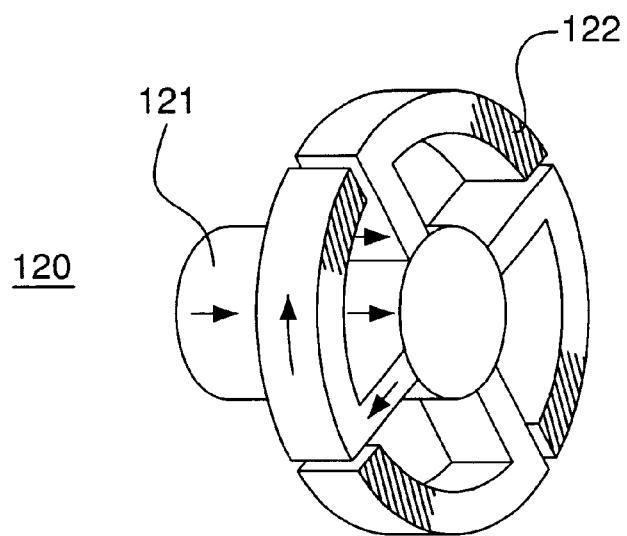
FIG. 2 is a perspective view of an exemplary magnetic field producing contact in accordance with the present invention.
Figure 3:
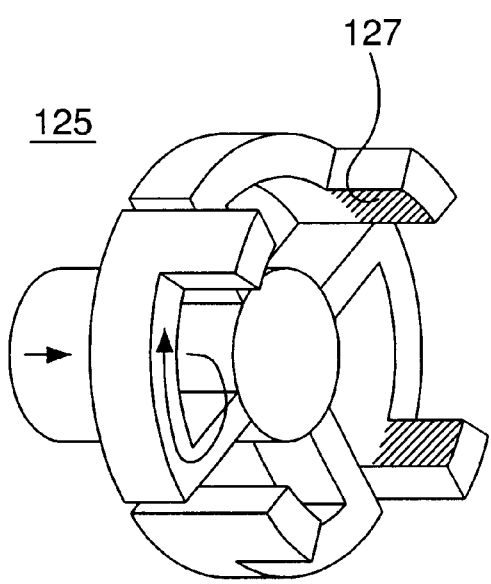
FIG. 3 is a perspective view of another exemplary magnetic field producing contact in accordance with the present invention.

An axial magnetic field is used for the Hall effect device 130 to change its impedance and limit the flowing current. The magnetic field producing contact structure 120, 140 generates a magnetic field as a result of the flowing current. Each magnetic field producing contact 120 and 140 can be realized in several different forms to provide contact structure 120, 140. FIG. 2 shows a perspective view of an exemplary contact 120 that can generate an axial magnetic field for the Hall effect device 130. The arrows show the desired direction of current flow through the contact 120. The contact 120 has connection surfaces 122 that are used to contact the Hall effect device 130. The connection surfaces 122 can either be flush with the ends of the device, as shown in FIG. 2, or can be raised as shown in the connection surfaces 127 of FIG. 3, depending on the associated contact areas of the Hall effect device 130. The contact 120 also has a base terminal 121 that may contact the Hall effect device 130 or the outside power system (e.g., power system 100), depending on the desired configuration.

A preferred Hall effect device 130 is an indium antimonium (InSb) based Hall effect resistor that changes its resistance depending on the magnetic field applied to it, although other materials such as indium arsenide, indium phosphide, and gallium arsenide maybe used as the preferred magnetoresistor material.

Magnetoresistors exhibit a resistance which varies in accordance with an applied vertical magnetic field. Most magnetoresistors exhibit positive magnetoresistance, with the resistance increasing in response to increases in magnetic field strength. The basis of the magnetoresistance is the Lorentz force, which causes the electrons to move in curved paths between collisions. This increases the effective electron path length, and is reflected as an increase in resistance.

As the electrons are reflected towards one side of the magnetoresistor, the accumulation of electrons along that side produces an internal transverse electric field which opposes and tends to negate the effect of the externally applied magnetic field. This phenomenon is well known and referred to as the Hall effect.

Corbino disks are circular disks of magnetoresistor material, with a conductive terminal at the hub or center of the disk, and a conductive ring encircling the hub terminal. The ring and hub terminal are formed on the same side of the disk, or can extend through the disk. The circularly symmetric configuration of the conductive ring perpendicular to the current flow prevents any local accumulations of charge, and thereby inhibits the development of a Hall field.

Figure 4:
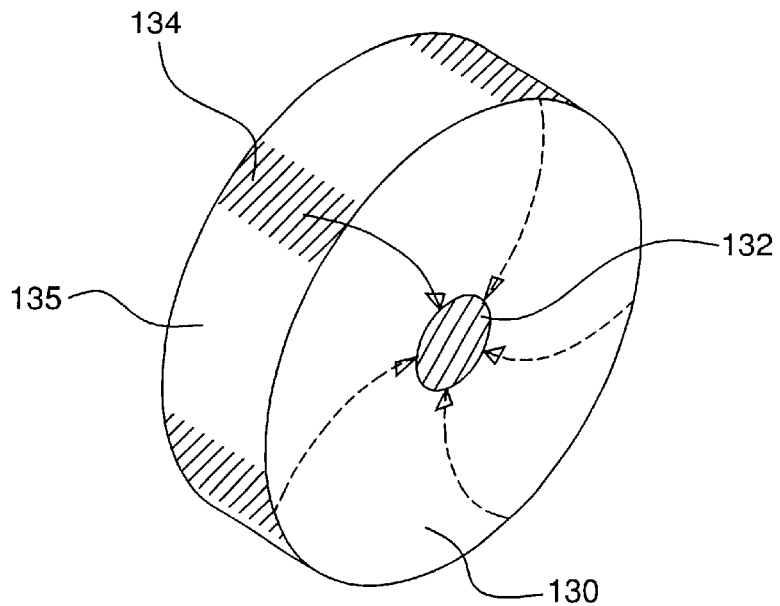
FIG. 4 is a perspective view of an exemplary Hall effect device in accordance with the present invention.
Figure 5:
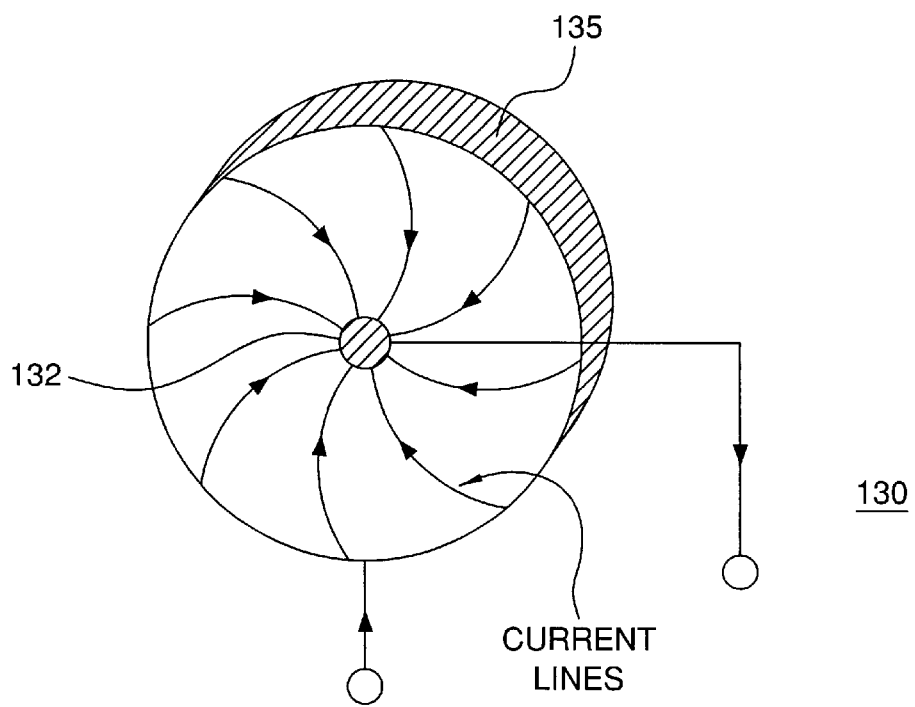
FIG. 5 is a side view of the Hall effect device of FIG. 4.

The shape of the Hall effect device 130 determines the effectiveness and applicability of the current limiting. In one exemplary embodiment, the Hall effect device 130 is disk shaped, such as a Corbino disk, a perspective view of which is shown in FIG. 4 and a side view of which is shown in FIG. 5. In this embodiment, the electrical terminals of the Hall effect device 130 are in the center of the disk (e.g., terminals 132) and at the outer perimeter of the disk 135 (e.g., terminals 134). The arrows shows the current flow.

Figure 6:
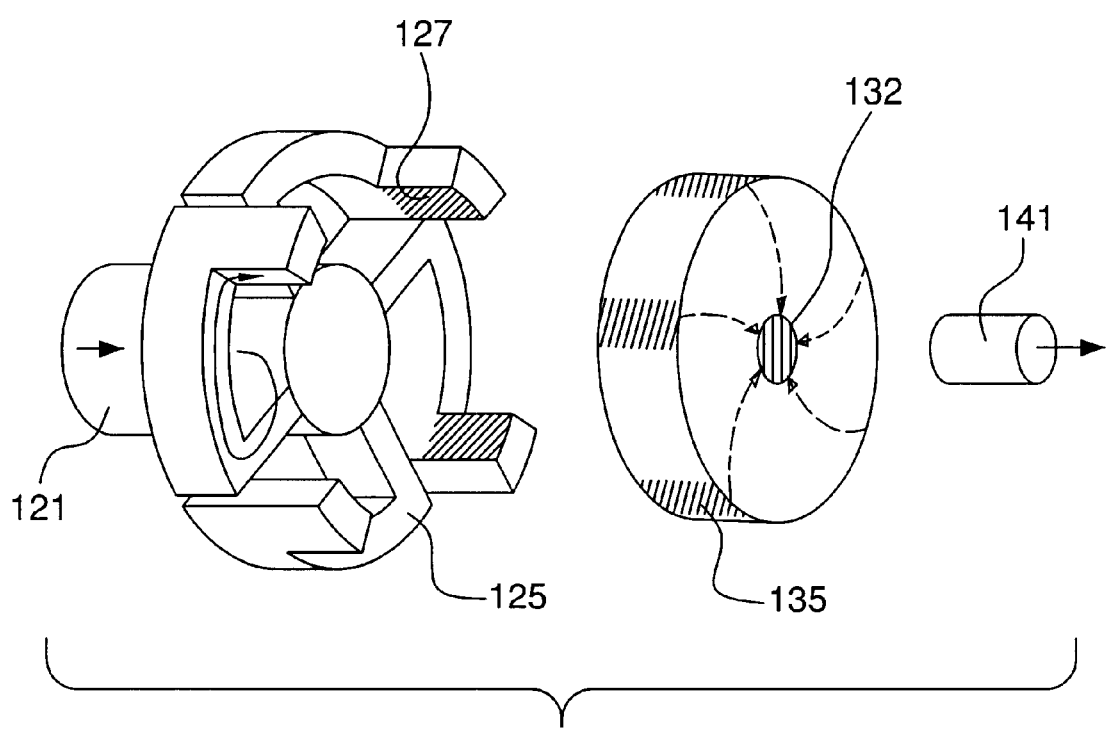
FIG. 6 is a perspective view, exploded, of an exemplary magnetic field producing contact structure and an exemplary Hall effect device in accordance with the present invention.

FIG. 6 shows a perspective view, exploded, of an exemplary magnetic field producing contact structure and an exemplary Hall effect device. In such an exemplary system, a magnetic field producing contact 125 and a plain butt contact 141 have a Hall effect device 130 sandwiched therebetween. In this manner, current originating at a first power system (e.g., power system 100) will flow from a base terminal 121 to the connection surfaces 127 of the first contact 120, into the Hall effect device 130, and from the connection surface 132 into the terminal 141 of the second contact. The Corbino disk has a hub terminal 132 on a layer of magnetoresistive material, and a surrounding conductive ring 135. Current flow is from the conductive ring 135 to the hub terminal 132.

Assuming that current has been applied to the Corbino disk (e.g., the Hall effect device 130) from the left hand side (from contact 125) and is traveling towards the right, current will enter the Corbino disk at its conductive ring 135 at its respective lead 134. From there, the current will radiate out through the magnetoresistor material to the hub terminal 132. If a magnetic field is applied, the current flow will bend in pinwheel fashion, thereby increasing the electron path length and the effective resistance of the device 130. In this manner the magnetic field strength can be perceived as a function of the resistance offered by the Corbino disk 130. Continuing with the current flow, current from the Corbino disk flows into the adjacent and touching contact 140 through the hub terminal 132.

Figure 7:
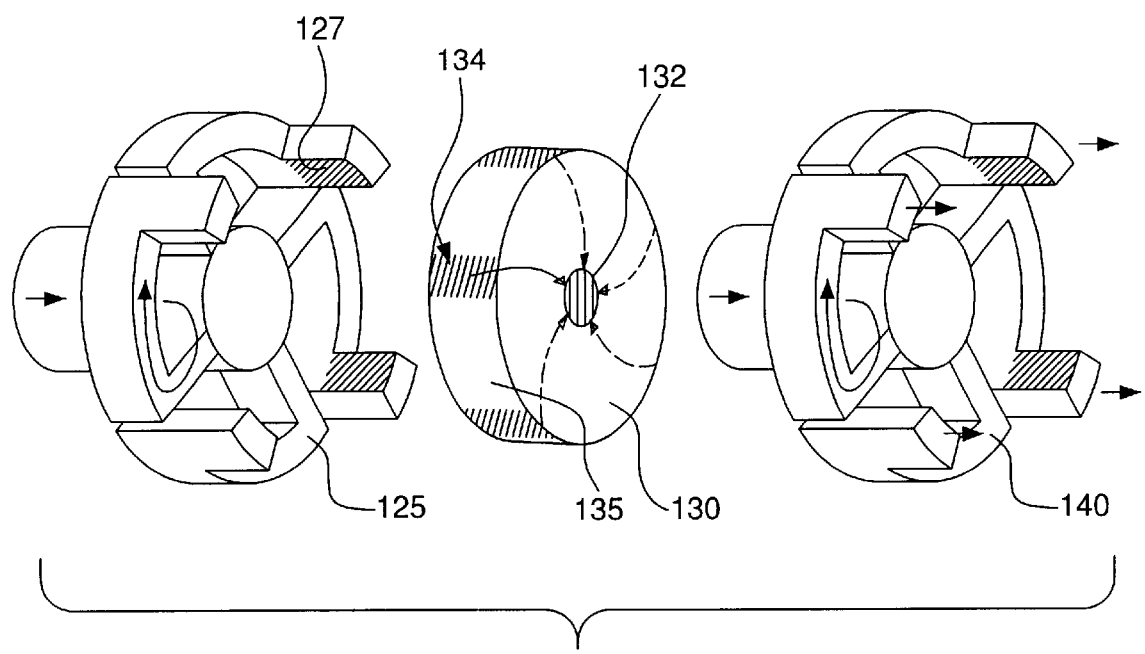
FIG. 7 is a perspective view, exploded, of another exemplary magnetic field producing contact structure and an exemplary Hall effect device in accordance with the present invention.

In another exemplary system, two identical contacts can be positioned in an opposed relationship, with the Hall effect device 130 disposed therebetween. In this configuration, as shown in FIG. 7 for example, the magnetic field will almost double and therefore increase the effectiveness of the current limiting action of the Corbino disk.

Figure 8:
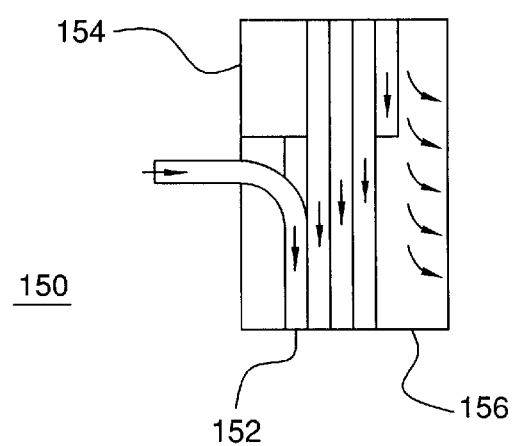
FIG. 8 is a side view of another exemplary magnetic field producing contact in accordance with the present invention.

FIG. 8 is a side view of another exemplary magnetic field producing contact 150 that can be used with the present invention. The contact comprises coil turns 152 wound around a support ring 154 and an equalizer ring 156.

Figure 9:
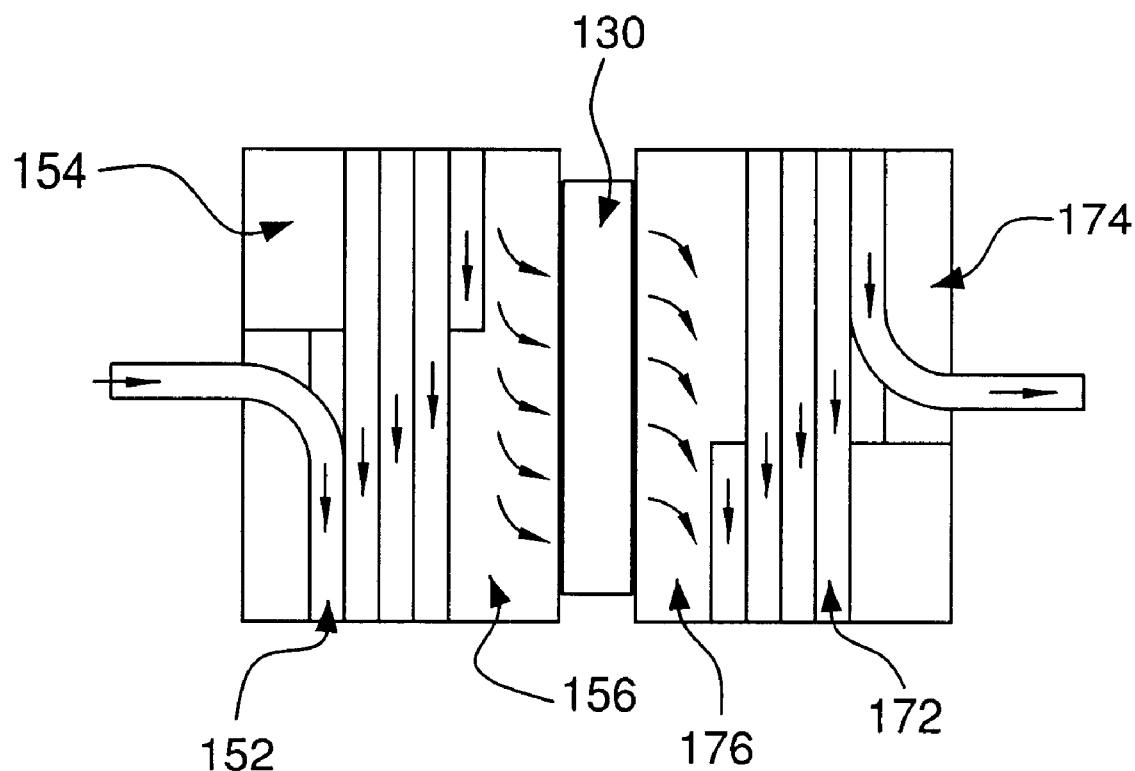
FIG. 9 is a side view, assembled, of an exemplary magnetic field producing contact structure and an exemplary Hall effect device in accordance with the present invention.

FIG. 9 shows another exemplary embodiment in which a Hall effect device 130 is sandwiched between two coil-like contacts 150, 170, each having coil turns 152, 172 wound in the same direction around associated support rings 154, 174 and equalizer rings 156, 176, thereby producing an axial magnetic field. In this case, the effectiveness of the Hall effect current limiting can be further enhanced at the expense of a small increase of the inductance of the total circuit.

The present invention provides current limiting for all power systems with no sensing, amplification, or any other electronic controls. Reliability is improved because there are no moving parts, sensors, or trip units. The current limiting is inherent to the device itself and can be implemented at low cost. The current in the circuit to be limited produces the magnetic field that is used to limit the current.

Although illustrated and described herein with reference to certain specific embodiments, the present invention is nevertheless not intended to be limited to the details shown. Rather, various modifications may be made in the details within the scope and range of equivalents of the claims and without departing from the invention.

What is claimed is:

1. A current limiting apparatus comprising:
    a Hall effect device having an axis such that when a magnetic field is applied substantially parallel to the axis, the resistance of the Hall effect device increases;
    a first contact capable of directing current flow to generate a magnetic field substantially parallel to the axis of the Hall effect device; and
    a second contact the Hall effect device disposed in electrical connection with the first contact and the second contact.

2. The current limiting apparatus of claim 1, wherein the Hall effect device is a Corbino disk and the axis is substantially coaxial with the Corbino disk.

3. The current limiting apparatus of claim 1, wherein the Hall effect device is an indium antimonium based Hall effect resistor.

4. The current limiting apparatus of claim 1, wherein the first contact is capable of generating an axial magnetic field for the Hall effect device.

5. The current limiting apparatus of claim 1, wherein the second contact is capable of generating a magnetic field parallel to the axis of the Hall effect device.

6. The current limiting apparatus of claim 1, wherein the first and second contacts are substantially identical.

7. The current limiting apparatus of claim 1, wherein each of the first contact and the second contact has a base terminal and at least one connection surface, one of the base terminal and the at least one connection surface in electrical contact with the Hall effect device.

8. The current limiting apparatus of claim 1, wherein the second contact is a butt contact.

9. The current limiting apparatus of claim 1, wherein the first and second contacts are positioned in an opposed relationship facing each other.

10. The current limiting apparatus of claim 1, wherein the first contact comprises a conductive portion that directs current substantially circumferentially with respect to the Hall effect device, thereby generating the magnetic field parallel to the axis of the Hall effect device.

11. The current limiting apparatus of claim 1, wherein the first contact comprises at least one arc shaped arm disposed circumferentially with respect to the Hall effect device.

12. The current limiting apparatus of claim 1, wherein the first contact comprises four arc shaped arms disposed circumferentially with respect to the Hall effect device.

13. A current limiting apparatus comprising:
    a first magnetic field producing contact comprising a plurality of coil turns;
    a second magnetic field producing contact comprising a second plurality of coil turns; and
    a Hall effect device disposed in electrical contact with the first contact and the second contact.

14. The current limiting apparatus of claim 13, wherein the first magnetic field producing contact comprises the plurality of coil turns wound around a support ring and an equalizer ring.

15. The current limiting apparatus of claim 14, wherein the second magnetic field producing contact comprises the second plurality of coil turns wound around a second support ring and a second equalizer ring.

16. The current limiting apparatus of claim 13, wherein the first and second contacts are substantially identical.

17. A method of limiting current in a power system comprising:
    providing current to a contact and a Hall effect device having an axis such that when a magnetic field is applied parallel to the axis, the resistance of the Hall effect device increases;
    generating, from the contact, a magnetic field parallel to the axis of the Hall effect device; and
    subjecting the Hall effect device to the magnetic field to limit the current.

18. The method of claim 17, wherein generating the axial magnetic field comprises providing current to a first contact and a second contact, wherein the Hall effect device is disposed between and in electrical contact with the first contact and the second contact.

19. The method of claim 17, wherein subjecting the Hall effect device to the axial magnetic field to limit the current comprises changing the impedance of the Hall effect device using the axial magnetic field.

* * * * *